(12) United States Patent
Huang et al.

(10) Patent No.: US 7,037,776 B2
(45) Date of Patent: May 2, 2006

(54) SINGLE POLYSILICON PROCESS FOR DRAM

(75) Inventors: Jenn-Ming Huang, Hsin-Chu (TW); Chen-Yong Lin, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/323,981

(22) Filed: Dec. 19, 2002

(65) Prior Publication Data

US 2004/0121533 A1 Jun. 24, 2004

(51) Int. Cl.
*H01L 21/8242* (2006.01)

(52) U.S. Cl. ............... 438/243; 438/246; 438/248
(58) Field of Classification Search ........ 438/238–256, 438/381–399
See application file for complete search history.

(56) References Cited

U.S. PATENT DOCUMENTS

| | | | |
|---|---|---|---|
| 4,577,395 A * | 3/1986 | Shibata | 438/386 |
| 4,761,385 A * | 8/1988 | Pfiester | 438/386 |
| 4,907,047 A | 3/1990 | Kato et al. | 357/23.6 |
| 5,208,657 A | 5/1993 | Chatterjee et al. | 257/302 |
| 5,574,621 A | 11/1996 | Sakamoto et al. | 361/321.1 |
| 5,792,686 A * | 8/1998 | Chen et al. | 438/244 |
| 5,793,075 A | 8/1998 | Alsmeier et al. | 257/296 |
| 6,107,135 A * | 8/2000 | Kleinhenz et al. | 438/249 |
| 6,177,697 B1* | 1/2001 | Cunningham | 257/301 |
| 6,794,698 B1* | 9/2004 | Perng et al. | 257/296 |

* cited by examiner

*Primary Examiner*—H. Jey Tsai
(74) *Attorney, Agent, or Firm*—Thomas, Kayden, Horstemeyer & Risley

(57) ABSTRACT

A method of fabricating a DRAM cell, comprising the following steps. A substrate is provided. An isolation structure is formed within the substrate. The substrate is patterned to form nodes adjacent the isolation structure. Doped regions are formed with the substrate adjacent the nodes. A gate dielectric layer is formed over the patterned substrate, lining the nodes. A conductive layer is formed over the gate dielectric layer, filling the nodes. The conductive layer is patterned to form: a top electrode capacitor within the nodes; and respective word lines over the substrate adjacent the top electrode capacitor; each word line having exposed side walls. Source/drain regions are formed adjacent the word lines.

45 Claims, 4 Drawing Sheets

SINGLE POLYSILICON PROCESS FOR DRAM

FIELD OF THE INVENTION

The present invention relates generally to semiconductor fabrication and more specifically to fabrication of DRAM structures.

BACKGROUND OF THE INVENTION

There are always three to four polysilicon (poly-Si or poly) layers required for commodity dynamic random access memory (DRAM). It is not very friendly for LOGIC foundry fabrication and it is very difficult to merge with high performance LOGIC process for so-called system-on-chip (SOC).

U.S. Pat. No. 6,177,697 B1 to Cunningham describes a single polysilicon process for a DRAM using a trench capacitor formed from poly 1— same as the gate.

U.S. Pat. No. 4,907,047 to Kato et al. describes a memory device having a trench capacitor.

U.S. Pat. No. 5,793,075 to Alsmeier et al. describes an integrated circuit capacitor that achieves a high capacitance by using an inversion layer in the substrate as the plate counter electrode for the capacitor.

U.S. Pat. No. 5,574,621 to Sakamoto et al. describes a capacitor for an integrated circuit having a conductive trench disposed below a bottom electrode layer that electrically connects to the bottom electrode layer to a semiconductor substrate.

U.S. Pat. No. 5,208,657 to Chatterjee et al. describes a DRAM cell and array of cells, together with a method of fabrication, wherein the cell includes one field effect transistor (FET) and one storage capacitor with the capacitor formed in a trench in a substrate and the transistor channel formed by epitaxial growth on the substrate.

SUMMARY OF THE INVENTION

Accordingly, it is an object of one or more embodiments of the present invention to provide an improved method of Other objects will appear hereinafter.

It has now been discovered that the above and other objects of the present invention may be accomplished in the following manner. Specifically, a substrate is provided. An isolation structure is formed within the substrate. The substrate is patterned to form nodes adjacent the isolation structure. Doped regions are formed with the substrate adjacent the nodes. A gate dielectric layer is formed over the patterned substrate, lining the nodes. A conductive layer is formed over the gate dielectric layer, filling the nodes. The conductive layer is patterned to form: a top electrode capacitor within the nodes; and respective word lines over the substrate adjacent the top electrode capacitor; each word line having exposed side walls. Source/drain regions are formed adjacent the word lines.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
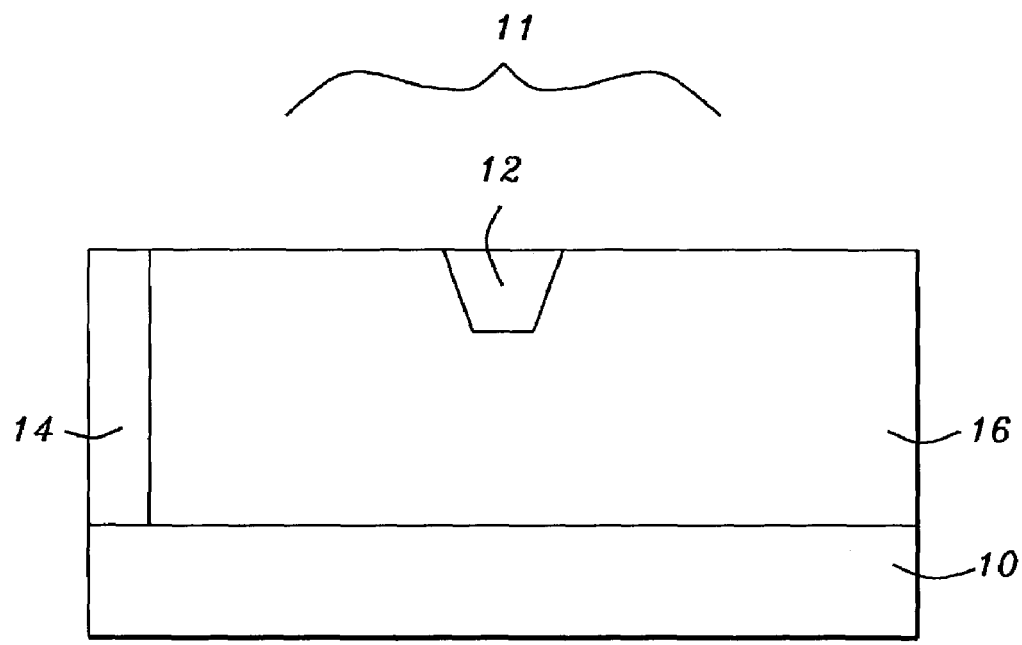
FIGS. 1 to 8 schematically illustrate a preferred embodiment of the present invention.

Initial Structure—FIG. 1

As shown in FIG. 1, substrate 10 includes an isolation structure 12 that is preferably a shallow trench isolation (STI) structure 12 as shown. STI 12 is formed within NMOS transistor region 11 of substrate 10.

Substrate 10 is preferably a silicon (Si), germanium (Ge) or gallium arsenide (GaAs) substrate, is more preferably a silicon substrate, and is understood to possibly include a semiconductor wafer or substrate.

A P well 14 and N well 16 are then formed within substrate 10. P well 14 is formed preferably using boron (B) ions to a concentration of preferably from about $10^{12}$ to $10^{13}$ atoms/cm$^2$ and more preferably from about 5E12 to 1E13 atoms/cm$^2$. N well 16 is formed preferably using $P_{31}$ ions to a concentration of preferably from about $10^{12}$ to $10^{13}$ atoms/cm$^2$ and more preferably from about 5E12 to 1E13 atoms/cm$^2$.

Figure 2:
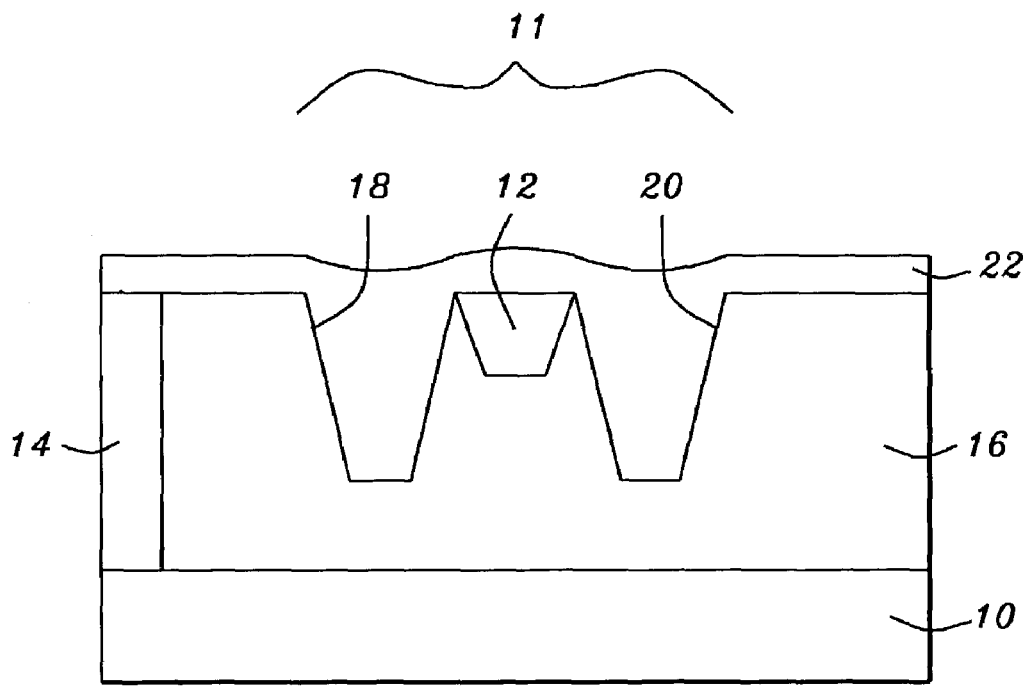

Formation of Nodes 18, 20—FIG. 2

As shown in FIG. 2, substrate 10 is patterned to form nodes 18, 20 adjacent STI 12 and within NMOS transistor region 11. Nodes 18, 20 are preferably from about 3000 to 10,000 Å wide and more preferably from about 5000 to 8000 Å wide, and are preferably from about 3000 to 20,000 Å deep and more preferably from about 5000 to 10,000 Å deep.

A doped silicon glass (DSG) layer 22 is then formed over patterned substrate 10, filling nodes 18, 20. Doped silicon glass layer 22 is preferably comprised of arsenic (As) silicon glass (ASG) or phosphorous (P) silicon glass (PSG) and is more preferably PSG silicon glass.

Figure 3:
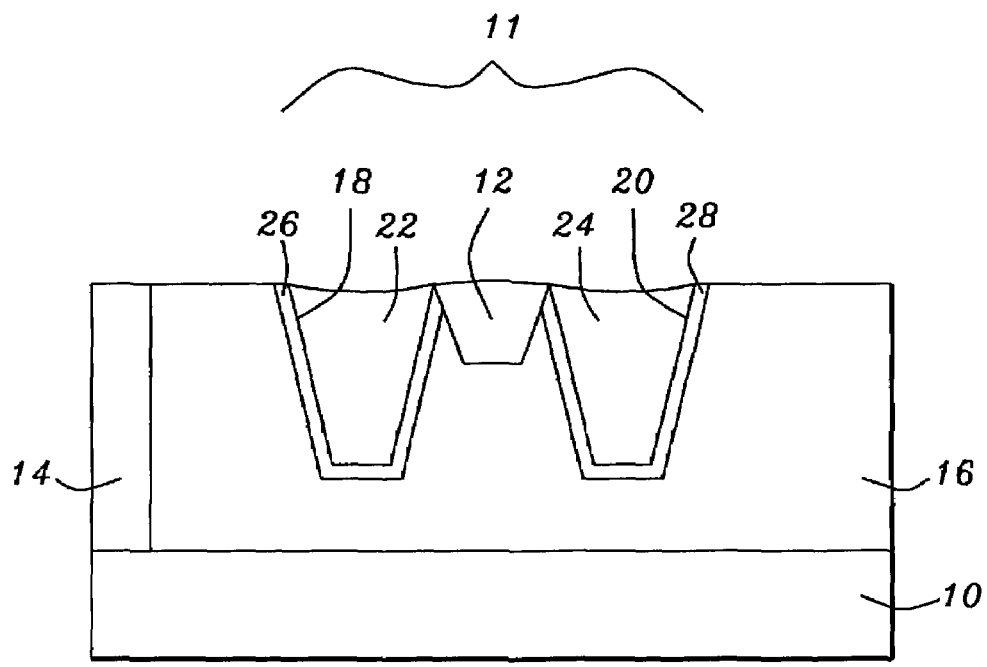

Partial Etch Back of DSG Layer 22 and Thermal Drive-In—FIG. 3

As shown in FIG. 3, DSG layer 22 is partially etched back to form respective DSG node plugs 22, 24 within nodes 18, 20.

A thermal drive-in step is them performed to form respective N diffusion regions 26, 28 within substrate 10 proximate DSG nodes plugs 22, 24. N diffusion regions 26, 28 are formed by diffusion of the dopants, either As or P, from the DSG material comprising DSG node plugs 22, 24 into the adjacent substrate by the thermal drive-in step.

N diffusion regions 26, 28 have a thickness of preferably from about 1000 to 5000 Å and more preferably from about 1500 to 2000 Å.

N diffusion regions 26, 28 are thus self-aligned and are formed by a solid phase diffusion process and avoids implant induced crystal defects. No extra masking step is required.

The thermal drive-in step is conducted at a temperature of preferably from about 900 to 1200° C. and more preferably from about 1000 to 1100° C. for preferably from about 10 to 60 minutes and more preferably from about 20 to 40 minutes.

Figure 4:
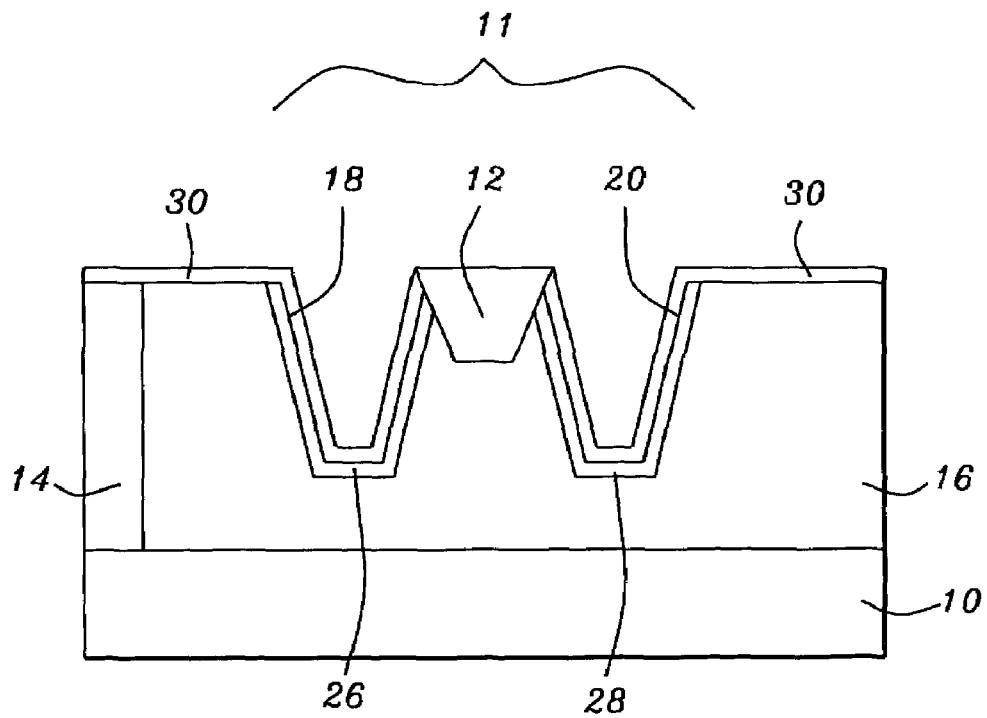

Wet Strip of DSG Node Plugs 22, 24, Optional Sacrificial Oxide Layer Growth and Gate Oxide Layer 30— FIG. 4

As shown in FIG. 4, DSG node plugs 22, 24 are removed from nodes 18, 20 by a wet stripping process. The wet strip process preferably uses HF or BOE and more preferably HF and is conducted under the following conditions:

temperature: preferably from about 25 to 100° C. and more preferably from about 25 to 60° C.; and time: preferably from about 60 to 180 seconds and more preferably from about 60 to 120 seconds.

An optional sacrificial oxide layer (not shown) may then be formed over patterned substrate 10, lining nodes 18, 20 to a thickness of preferably from about 50 to 150 Å and more preferably from about 70 to 120 Å. If formed, the optional sacrificial oxide layer is removed before the growth of gate oxide layer 30.

Gate dielectric layer 30, preferably comprised of gate oxide as will be used hereafter for illustrative purposes, is then grown over patterned substrate 10, lining nodes 18, 20 to a thickness of preferably from about 15 to 200 Å and more preferably from about 70 to 100 Å.

Figure 5:
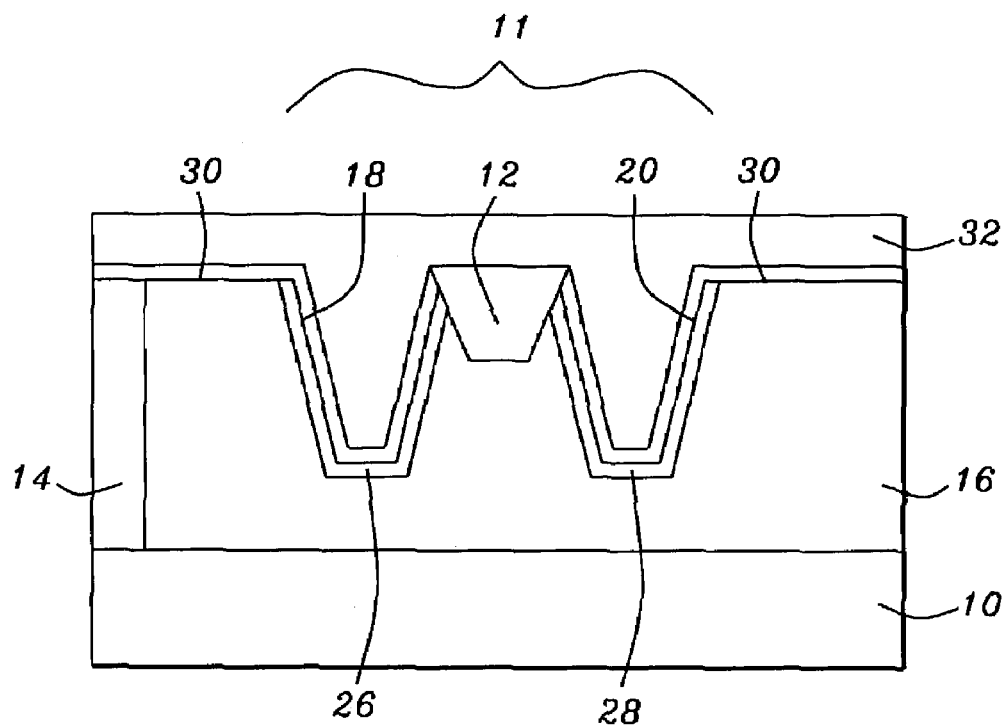

Poly-1 Layer 32 Deposition and Optional CMP—FIG. 5

As shown in FIG. 5, a conductive layer 32, preferably comprised of poly-1 (polysilicon-1) as will be used hereafter for illustrative purposes, is formed over gate oxide layer 30, lining nodes 18, 20. Poly-1 layer 32 is formed to a thickness of preferably from about 3000 to 10,000 Å and more preferably from about 4000 to 8000 Å.

Poly-1 layer 32 may then be optionally planarized by a chemical mechanical polishing (CMP) process to a thickness of preferably from about 1000 to 3000 Å and more preferably from about 1500 to 2000 Å.

Patterning of Poly-1 Layer 32 to Form Word Lines 34, 36 and Top Electrode Capacitor 38; Cell LDD Implants 40—FIG. 6

Figure 6:
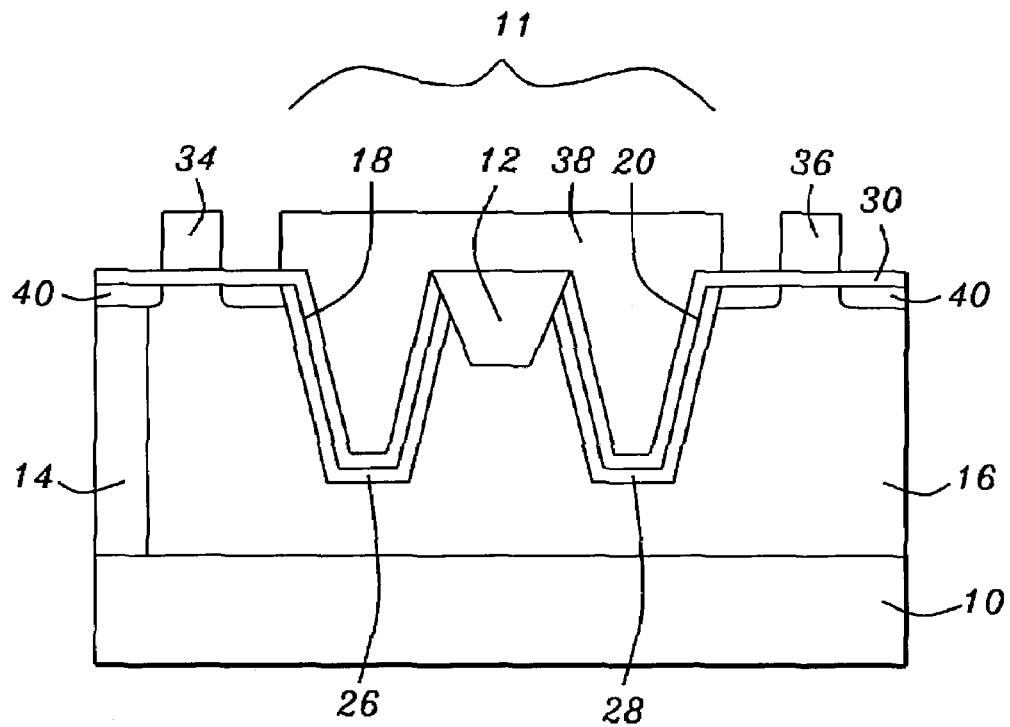

As shown in FIG. 6, poly-1 layer 32 is patterned to form top electrode capacitor 38 within NMOS transistor region 11 and, for example, word lines 34, 36 adjacent top electrode capacitor 38.

Cell LDD implants 40 are then formed within patterned substrate 10 preferably using $P_{31}$ ions to a concentration of preferably from about $10^{13}$ to $10^{14}$ atoms/cm$^2$ and more preferably from about 3E13 to 7E13 atoms/cm$^2$.

Figure 7:
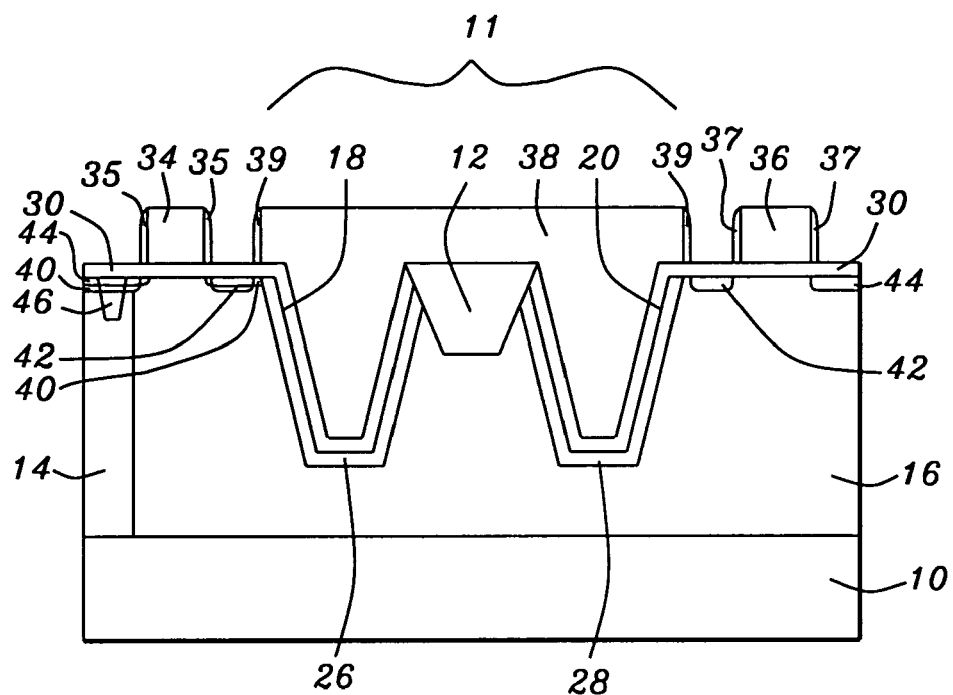

Formation of N-LDD and P-LDD Implants 41, 43, Spacers 35, 37, 39 and Source/Drains 42, 44—FIG. 7

As shown in FIG. 7, N-LDD implants 41 are formed within patterned substrate 10 preferably using P ions to a concentration of preferably from about $10^{13}$ to $10^{14}$ atoms/cm$^2$ and more preferably from about 3E13 to 7E13 atoms/cm$^2$. The NLDD could be either the same or different cell LDD. It is for periphery NMOS.

As shown in FIG. 7, P-LDD implants 43 are formed within patterned substrate 10 preferably using B or BFC ions to a concentration of preferably from about $10^{13}$ to $10^{14}$ atoms/cm$^2$ and more preferably from about 3E13 TO 5E13 atoms/cm$^2$.

N-LDD and P-LDD implants 41, 43 are formed before formation of sidewall spacers 35, 37, 39.

Respective sidewall spacers 35, 37, 39 are then formed over the exposed side walls of word lines 34, 36 and top electrode capacitor 38 to a lower width of preferably from about 500 to 2000 Å and more preferable from about 1000 to 1500 Å. Sidewall spacers 35, 37, 39 are preferably comprised of silicon oxide ($SiO_2$), silicon nitride ($Si_3N_4$), SiON or a composite ($SiO_2/Si_3N_4/SiO_2$) and are more preferably silicon oxide or silicon nitride.

Optional N minus (N−) source/drain (N−S/D) implants 42 adjacent sidewall spacers 39 of top electrode capacitor and inner sidewall spacers 35, 37 of word lines 34, 36 and N−S/D implants 44 outboard of outer sidewall spacers 35, 37 of word lines 34, 36 may then be formed within patterned substrate 10. N+S/D implants 46 preferably have a concentration of from about $10^{14}$ to $10^{15}$ atoms/cm$^2$.

A subsequent activation process may employ rapid thermal oxidation (RTO) or furnace processes.

Figure 8:
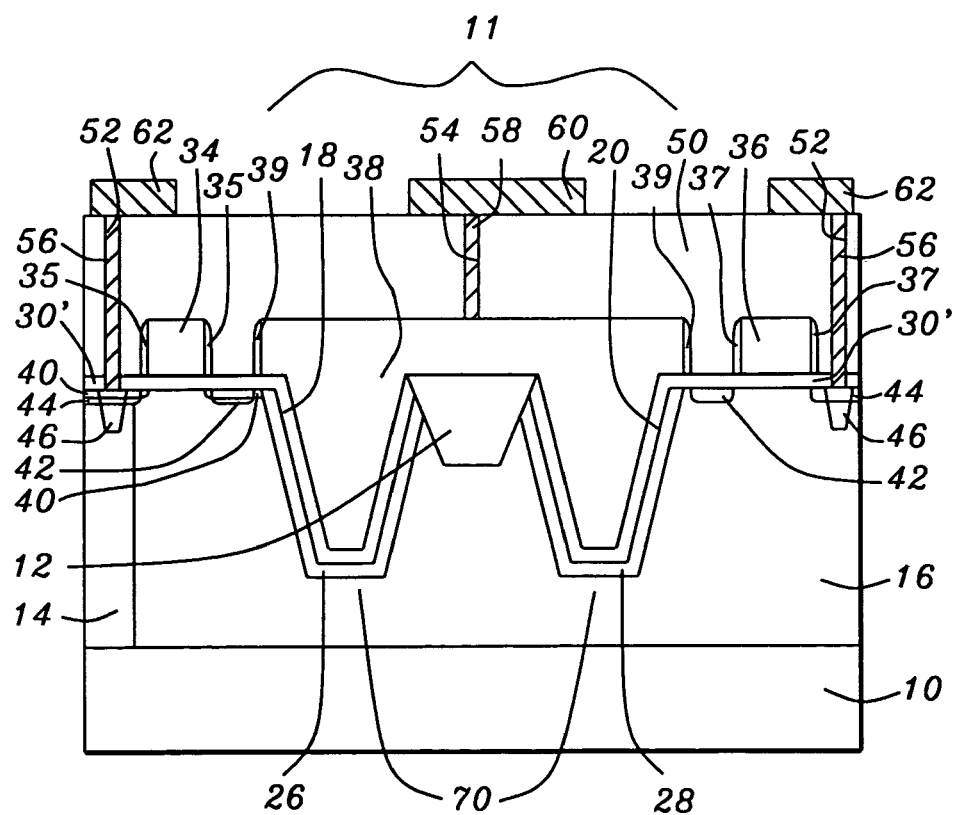

ILD Layer 50, First and Second Contacts 56, 58 and Metal-1 60, 62 Formation—FIG. 8

As shown in FIG. 8, interlevel dielectric (ILD) layer 50 is formed over patterned substrate 10, word lines 34, 36 and top electrode capacitor 38 to a thickness of preferably from about 5000 to 10,000 Å and more preferably from about 7000 to 8000 Å.

ILD layer 50 and gate oxide layer 30 are then patterned to form, for example, first contact openings 52 exposing the outboard S/Ds 44 of word lines 34, 36 and second contact opening 54 exposing a portion of top electrode capacitor 38. Respective first and second metal contacts 56, 58 are then formed within first and second contact openings 52, 54. First and second metal contacts 56, 58 are preferably comprised of tungsten copper or aluminum and are more preferably tungsten.

A metal-1 layer is then formed and pattered over ILD layer 50 to form: bit lines 62 over, and in electrical contact with, first metal contacts 56; and metal structure 60 to Vcc/2 (half of chip operation voltage) over, and in electrical contact with, second metal contact 58. Bit lines 62 and metal structure 60 are preferably comprised of copper, aluminum or AlCu and are more preferably AlCu.

Further processing may then proceed.

Advantages of the Present Invention

The advantages of one or more embodiments of the present invention include:

1. single poly and gate oxide process are inexpensive and are completely compatible with high performance LOGIC;
2. efficiently increase capacitor for DRAM cell instead of gate oxide—the gate oxide is very thin than that of capacitor dielectric of commodity DRAM; 3. a very friendly process for a LOGIC foundry fabrication, i.e. less poly furnace;
4. embedded DRAM is very cost effective;
5. only one extra mask is required to manufacture 1T1C (one transistor, one capacitor) DRAM as compared to LOGIC process;
6. the cell size is only one-sixth of a 6T SRAM fabricated by a LOGIC process—i.e. 1T1C fabricated in accordance with the present invention=1.39×0.5=0.695 μm$^2$ while 6T fabricated by a LOGIC process=1.84× 2.53=4.655 μm$^2$;
7. for a 1T SRAM application, the cell size if only one-half of that of a LOGIC process because unit capacitance is higher than planar structure of 1TSRAM; and
8. the process of the present invention is shrinkable beyond the 0.18 μm generation, even for a 1T SRAM application as the depth of the capacitor trench can overcome the planar area shrinkage.

While particular embodiments of the present invention have been illustrated and described, it is not intended to limit the invention, except as defined by the following claims.

We claim:

1. A method of fabricating a DRAM cell, comprising the steps of:
   providing a substrate;
   forming an isolation structure within the substrate;
   patterning the substrate to form nodes adjacent the isolation structure;
   forming doped silicon glass node plugs within the nodes;
   forming respective N diffusion regions within substrate adjacent the doped silicon glass node plugs using a thermal drive-in process, wherein the N diffusion regions are exposed around top portions of the doped silicon glass node plugs;

removing the doped silicon glass node plugs;

forming a gate dielectric layer over the patterned substrate, lining the nodes;

forming a conductive layer over the gate dielectric layer, filling the nodes;

patterning the conductive layer to form:
   a top electrode capacitor within the nodes; and
   respective word lines over the substrate adjacent the top electrode capacitor; each
     word line having exposed side walls; and forming source/drain regions adjacent the word lines, wherein the source/drain regions are electrically connected to the N diffusion regions.

2. The method of claim 1, wherein the isolation structure is a shallow trench isolation structure and the substrate is a silicon substrate.

3. The method of claim 1, wherein a P well and an N well are formed within the substrate before the formation of the nodes.

4. The method of claim 1, further comprising the step of forming a P well and an N well within the substrate before the formation of the nodes; the P well being formed with B ions to a concentration of from about $10^{12}$ to $10^{13}$ atoms/cm$^2$ and the N well being formed with $P_{31}$ ions to a concentration of from about $10^{12}$ to $10^{13}$ atoms/cm$^2$.

5. The method of claim 1, wherein the nodes are from about 3000 to 10,000 Å wide and from about 3000 to 20,000 Å deep.

6. The method of claim 1, wherein the doped silicon glass node plugs are comprised of arsenic doped silicon glass or phosphorous doped silicon glass.

7. The method of claim 1, wherein the thermal drive-in process is performed at a temperature of from about 900 to 1200° C. and for from about 10 to 60 minutes.

8. The method of claim 1, wherein the N diffusion regions have a thickness of from about 1000 to 5000 Å.

9. The method of claim 1, wherein the doped silicon glass node plugs are removed using a wet strip process.

10. The method of claim 1, wherein the doped silicon glass node plugs are removed using a wet strip process using HF or BOE, at a temperature of from about 25 to 100° C. and for from about 60 to 180 seconds.

11. The method of claim 1, wherein the gate dielectric layer has a thickness of from about 15 to 200 Å.

12. The method of claim 1, wherein the gate dielectric layer is a gate oxide layer.

13. The method of claim 1, wherein the conductive layer has a thickness of from about 3000 to 10,000 Å.

14. The method of claim 1, wherein the conductive layer is comprised of polysilicon.

15. The method of claim 1, further comprising the step of forming cell LDD implants within patterned substrate before formation of the source/drain regions; the cell LDD implants being formed with $P_{31}$ ions to a concentration of from about $10^{13}$ to $10^{14}$ atoms/cm$^2$.

16. The method of claim 1, further comprising the steps of:
   forming N-LDD implants within patterned substrate; and
   forming P-LDD implants within patterned substrate;
   before formation of the source/drain regions.

17. The method of claim 1, further comprising the steps of:
   forming N-LDD implants within patterned substrate; the N-LDD implants being formed with P ions to a concentration of from about $10^{13}$ to $10^{14}$ atoms/cm$^2$; and
   forming P-LDD implants within patterned substrate; the N-LDD implants being formed with ions selected from the group consisting of B ions and BFC ions to a concentration of from about $10^{13}$ to $10^{14}$ atoms/cm$^2$;
   before formation of the sidewall spacers.

18. A method of fabricating a DRAM cell, comprising the steps of:
   providing a substrate;
   forming an isolation structure within the substrate;
   patterning the substrate to form nodes adjacent the isolation structure;
   forming doped silicon glass node plugs within the nodes;
   forming respective N diffusion regions within substrate adjacent the doped silicon glass node plugs using a thermal drive-in process, wherein the N diffusion regions are exposed around top portions of the doped silicon glass node plugs;
   removing the doped silicon glass node plugs;
   forming a gate oxide layer over the patterned substrate, lining the nodes;
   forming a polysilicon layer over the gate oxide layer, filling the nodes;
   patterning the polysilicon layer to form:
     a top electrode capacitor within the nodes; and
     respective word lines over the substrate adjacent the top electrode capacitor; each
       word line having exposed side walls; and
   forming source/drain regions adjacent the word lines, wherein the source/drain regions are electrically connected to the N diffusion regions.

19. The method of claim 18, wherein the isolation structure is a shallow trench isolation structure and the substrate is a silicon substrate.

20. The method of claim 18, wherein a P well and an N well are formed within the substrate before the formation of the nodes.

21. The method of claim 18, further comprising the step of forming a P well and an N well within the substrate before the formation of the nodes; the P well being formed with B ions to a concentration of from about $10^{12}$ to $10^{13}$ atoms/cm$^2$ and the N well being formed with $P_{31}$ ions to a concentration of from about $10^{12}$ to $10^{13}$ atoms/cm$^2$.

22. The method of claim 18, further comprising the step of forming a P well and an N well within the substrate before the formation of nodes; the P well being formed with B ions to a concentration of from about 5E12 to 1E13 atoms/cm$^2$ and the N well being formed with $P_{31}$ ions to a concentration of from about 5E12 to 1E13 atoms/cm$^2$.

23. The method of claim 18, wherein the nodes are from about 3000 to 10,000 Å wide and from about 3000 to 20,000 Å deep.

24. The method of claim 18, wherein the nodes are from about 5000 to 8000 Å wide and from about 5000 to 10,000 Å deep.

25. The method of claim 18, wherein the doped silicon glass node plugs are comprised of arsenic doped silicon glass or phosphorous doped silicon glass.

26. The method of claim 18, wherein the doped silicon glass node plugs are comprised of PSG doped silicon glass.

27. The method of claim 18, wherein the thermal drive-in process is performed at a temperature of from about 900 to 1200° C. and for from about 10 to 60 minutes.

28. The method of claim 18, wherein the thermal drive-in process is performed at a temperature of from about 1000 to 1100° C. and for from about 20 to 40 minutes.

29. The method of claim 18, wherein the N diffusion regions have a thickness of from about 1000 to 5000 Å.

30. The method of claim 18, wherein the N diffusion regions have a thickness of from about 1500 to 2000 Å.

31. The method of claim 18, wherein the doped silicon glass node plugs are removed using a wet strip process.

32. The method of claim 18, wherein the doped silicon glass node plugs are removed using a wet strip process using HF or BOE, at a temperature of from about 25 to 100° C. and for from about 60 to 180 seconds.

33. The method of claim 18, wherein the doped silicon glass node plugs are removed using a wet strip process using HF at a temperature of from about 25 to 60° C. and for from about 60 to 120 seconds.

34. The method of claim 18, wherein the gate oxide layer has a thickness of from about 15 to 200 Å.

35. The method of claim 18, wherein the gate oxide layer has a thickness of from about 70 to 100 Å.

36. The method of claim 18, wherein the polysilicon layer has a thickness of from about 3000 to 10,000 Å.

37. The method of claim 18, wherein the polysilicon layer has a thickness of from about 4000 to 8000 Å.

38. The method of claim 18, further comprising the step of forming cell LDD implants within patterned substrate before forming the source/drain regions.

39. The method of claim 18, further comprising the step of forming cell LDD implants within patterned substrate before formation of the source/drain regions; the cell LDD implants being formed with $P_{31}$ ions to a concentration of from about $10^{13}$ to $10^{14}$ atoms/cm$^2$.

40. The method of claim 18, farther comprising the step of forming cell LDD implants within patterned substrate before formation of the source/drain regions; the cell LDD implants being formed with $P_{31}$ ions to a concentration of from about 3E13 to 7E13 atoms/cm$^2$.

41. The method of claim 18, further comprising the steps of:
   forming N-LDD implants within patterned substrate; and
   forming P-LDD implants within patterned substrate;
   before formation of the source/drain regions.

42. The method of claim 18, further comprising the steps of:
   forming N-LDD implants within patterned substrate; the N-LDD implants being formed with P ions to a concentration of from about $10^{13}$ to $10^{14}$ atoms/cm$^2$; and
   forming P-LDD implants within patterned substrate; the N-LDD implants being formed with ions selected from the group consisting of B ions and BFC ions to a concentration of from about $10^{13}$ to $10^{14}$ atoms/cm$^2$;
   before formation of the sidewall spacers.

43. The method of claim 18, further comprising the steps of:
   forming N-LDD implants within patterned substrate; the N-LDD implants being formed with P ions to a concentration of from about 3E13 to 7E13 atoms/cm$^2$; and
   forming P-LDD implants within patterned substrate; the N-LDD implants being formed with ions to a concentration of from about 3E13 to 5E13 atoms/cm$^2$;
   before formation of the source/drain regions.

44. The method of claim 1, further comprising the step of forming cell LDD implants within patterned substrate before forming the source/drain regions; wherein the cell LDD implants are electrically connected to the N diffusion regions.

45. The method of claim 18, further comprising the step of forming cell LDD implants within patterned substrate before forming the source/drain regions; wherein the cell LDD implants are electrically connected to the N diffusion regions.

* * * * *